(12) United States Patent
Loh et al.

(10) Patent No.: US 7,089,139 B2
(45) Date of Patent: Aug. 8, 2006

(54) METHOD AND APPARATUS FOR CONFIGURATION OF AUTOMATED DEBUG OF IN-CIRCUIT TESTS

(75) Inventors: Aik Koon Loh, Singapore (SG); Keen Fung Wai, Singapore (SG); Tiam Hock Tan, Singapore (SG); Roy H. Williams, Loveland, CO (US); Daniel Z. Whang, Singapore (SG); Chen Ni Low, Singapore (SG); Ellis Yuan, Pingzhen (TW)

(73) Assignee: Agilent Technologies, Inc., Palo Alto, CA (US)

( * ) Notice: Subject to any disclaimer, the term of this patent is extended or adjusted under 35 U.S.C. 154(b) by 1 day.

(21) Appl. No.: 10/919,170

(22) Filed: Aug. 16, 2004

(65) Prior Publication Data
US 2006/0036390 A1 Feb. 16, 2006

(51) Int. Cl.
*G06F 7/02* (2006.01)
(52) U.S. Cl. .................... 702/117; 702/118; 702/182; 702/183
(58) Field of Classification Search ............ 702/85, 702/104, 150, 179, 181, 182, 117, 118; 705/38, 705/40; 714/38; 715/500, 526
See application file for complete search history.

(56) References Cited

U.S. PATENT DOCUMENTS 6,915,454 B1 * 7/2005 Moore et al. ............... 714/38
2005/0086579 A1 * 4/2005 Leitner et al. ............. 715/500

* cited by examiner

*Primary Examiner*—Marc S. Hoff
*Assistant Examiner*—Felix Suarez

(57) ABSTRACT

A method for configuring an automated in-circuit test debugger is presented. The novel test debug and optimization configuration technique configures expert knowledge into a knowledge framework for use by an automated test debug and optimization system for automating the formulation of a valid stable in-circuit test for execution on an integrated circuit tester. In a system that includes a rule-based controller for controlling interaction between the test-head controller of an integrated circuit tester and an automated debug system, the invention includes a knowledge framework and a rule-based editor. The knowledge framework stores test knowledge in the representation of rules that represent a debugging strategy. The rule-based editor facilitates the use of rules as knowledge to debug or optimize an in-circuit test that is to be executed on the integrated circuit tester.

18 Claims, 12 Drawing Sheets

120

124

METHOD AND APPARATUS FOR CONFIGURATION OF AUTOMATED DEBUG OF IN-CIRCUIT TESTS

BACKGROUND OF THE INVENTION

The increasing reliance upon computer systems to collect, process, and analyze data has led to the continuous improvement of the system assembly process and associated hardware. With the improvements in speed and density of integrated circuits, the cost and complexities of designing and testing these integrated circuits has dramatically increased. Currently, large complex industrial integrated circuit testers (commonly referred to in the industry as "Automated Test Equipment" or "ATE") perform complex testing of integrated circuit devices, such as integrated circuits, printed circuit boards (PCBs), multi-chip modules (MCMs), System-on-Chip (SOC) devices, printed circuit assemblies (PCAs), etc. The tests that must be performed may include, among others, in-circuit test (ICT), functional test, and structural test, and are designed to verify proper structural, operational, and functional performance of the device under test (DUT).

An example of an automated test is the performance of an in-circuit test. In-circuit testing, which verifies the proper electrical connections of the components on the printed circuit board (PCB), is typically performed using a bed-of-nails fixture or robotic flying-prober (a set of probes that may be programmably moved). The bed-of-nails fixture/robotic flying-prober probes nodes of the device under test, applies a set of stimuli, and receives measurement responses. An analyzer processes the measurement responses to determine whether the test passed or failed.

A typical in-circuit test will cover many thousands of devices, including resistors, capacitors, diodes, transistors, inductors, etc. Tests are typically passed to the tester via some type of user interface. Typically, the user interface allows a technician to enter various configurations and parameters for each type of device to automatically generate tests for devices of that type. However, for various reasons, it is often the case that a fairly significant percentage (e.g., 20%) of the automatically generated tests are faulty in that when executed on a known good device under test, the test is unable to determine the status of the device or component under test. Clearly, for devices under test that include thousands of components, this results in a large number of tests that must be manually repaired. Expert technicians typically know how to repair a faulty test. However, with such a large number of faulty tests to repair, a large (and therefore, very costly) amount of time may be spent in test debug and optimization rather than in actual testing of the device itself. The time spent in debug is also dependent on the amount of knowledge and experience of the test engineer.

It would therefore be desirable to capture the knowledge of experienced test engineers and formulate it into a format that s reusable by automated test systems. More generally, it would be desirable to develop a method and framework for binding complex actions into rules and rule sets associated with devices under test.

SUMMARY OF THE INVENTION

The present invention is a method and apparatus for binding knowledge and experience into a reusable rule format and storage framework that can be used by a test formulating engine in creating viable tests. In accordance with the invention, a method and system for configuring an automated test associated with a component to be tested on a tester is provided in which one or more validation criteria are associated with one or more actions to be performed to generate first associations, the one or more actions are associated with one or more rules to generate second associations, and one or more of the one or more rules are associated with the component to be tested on the tester to generate third associations. The first associations, the second associations, and the third associations are maintained in a knowledge framework to be reused for configuration of various tests. In a preferred embodiment, one or more rules are associated with a rule set, which is associated with the component to be tested, and the one or more rules associated with the rule set preferably each have an associated priority level indicating an order that the respective rule should be processed with respect to others of the one or more rules associated with the rule set.

Each of the above techniques may be implemented in hardware, software stored on a computer readable storage medium tangibly embodying program instructions implementing the technique, or a combination of both.

Preferably, the first, second, and third associations are extracted from a user by way of a user input graphical user interface in conjunction with a knowledge framework interface that stores the associations in a knowledge framework (i.e., in storage memory).

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
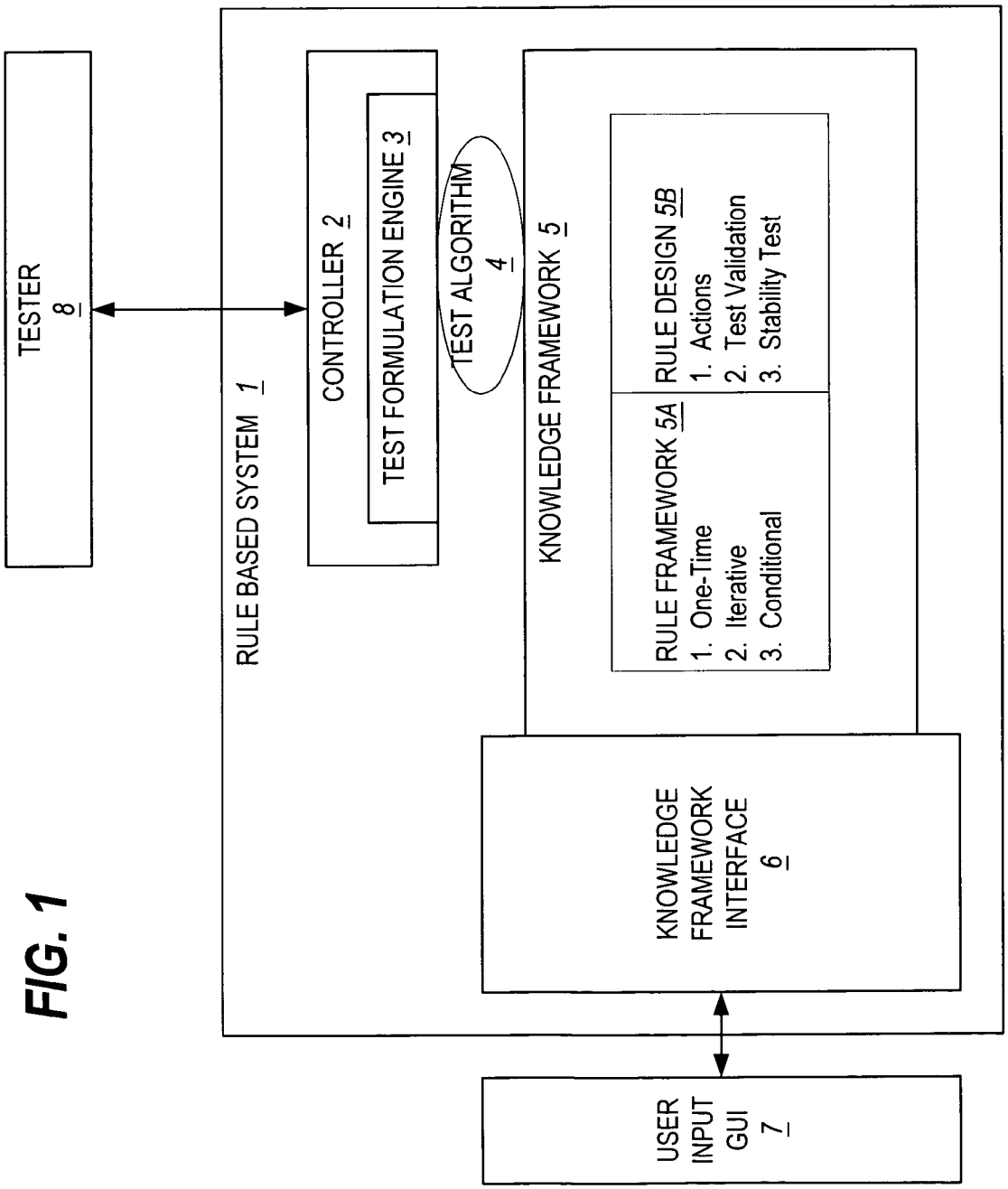
FIG. 1 is a block diagram of a rule-based system in accordance with the invention.

Turning now to the invention, FIG. 1 shows a rule based system 1 which utilizes the invention. As illustrated, the rule based system 1 includes three main components, namely a rule-based system controller 2, a knowledge framework 5, and a knowledge framework interface 6/user input graphical user interface (GUI) 7. The rule-based system controller 2 controls the interaction between a tester 8 and the rule-based system 1. The knowledge framework 5 contains the test knowledge, including rule framework 5a and rule design 5b. The knowledge framework interface 6 and user input GUI 7 are together used to capture user knowledge into assns of rule sets, rules, and actions.

Figure 2:
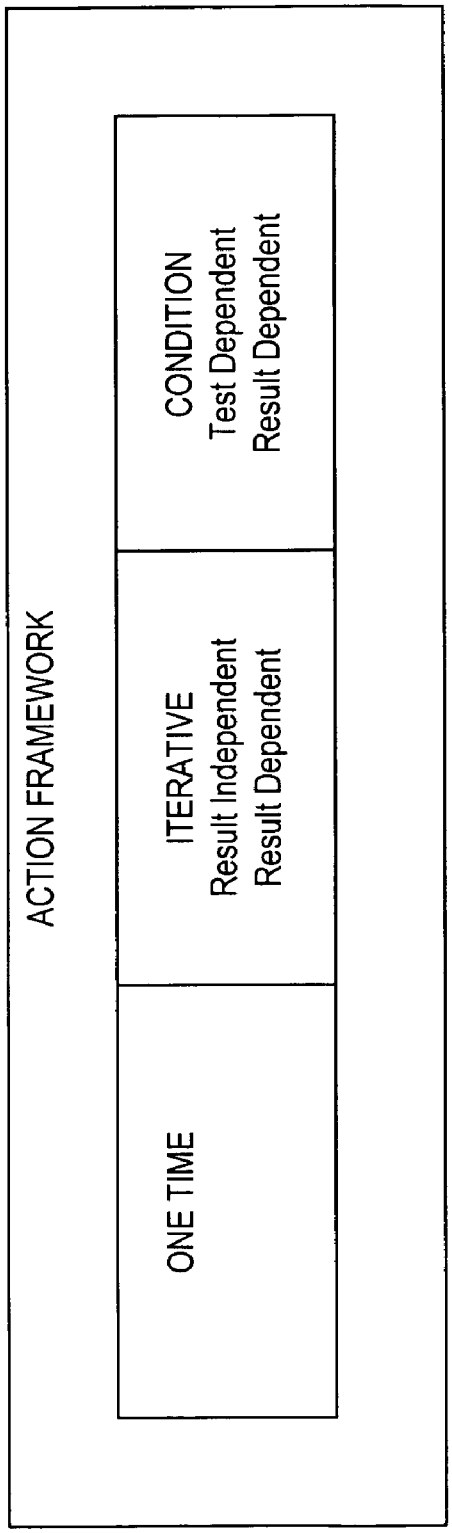
FIG. 2 is block diagram of an action framework.

FIG. 2 illustrates a preferred embodiment of the action framework. As illustrated, there are three main categories of actions, namely one-time, iterative and condition. The "one-time" class is a one-off test that is independent of the testing environment and it is similar to a normal manual test.

Within the iterative class, there are two sub-categories, namely test result independent and test result dependent. The condition class comprises two sub-categories, namely test dependent and result dependent.

Figure 3:
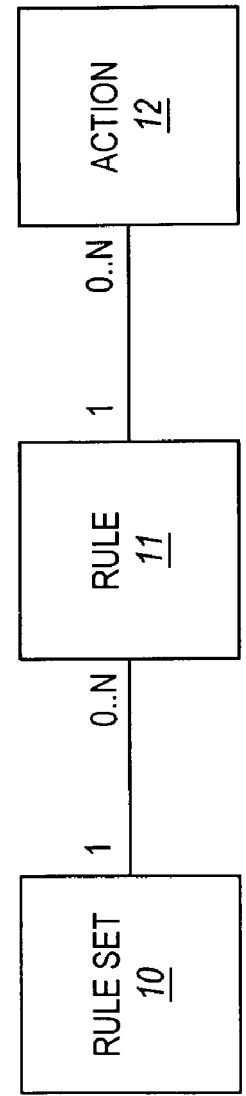
FIG. 3 is a relationship diagram illustrating the relationship between a rule set, rules, and actions.

In the preferred embodiment, a user input graphical user interface is used to configure and maintain the relationships between rule sets, rules and actions. FIG. 3 is a relationship diagram illustrating the relationship between a rule set 10, rules 11, and actions 12. In particular, each rule set 10 may be associated with (i.e., mapped to) zero or more rules 11, and each of those rules 11 may be associated with zero or more actions 12.

Figure 4:
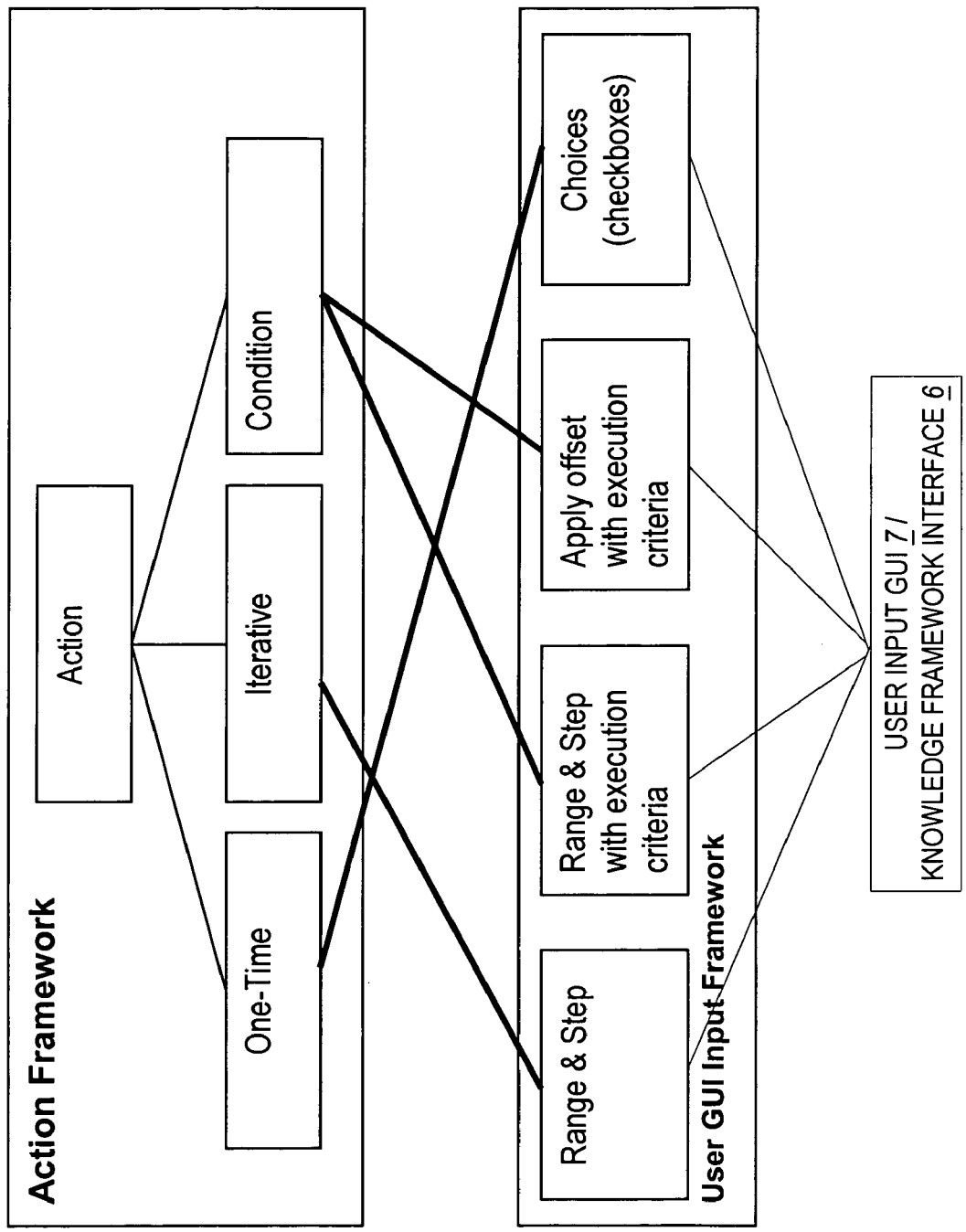
FIG. 4 is a relationship diagram illustrating the relationship between the action framework and the user input interface.

The relationship between the action framework and the user input accepted during rule creation by the graphical user interface 7 and knowledge framework interface 6 is shown in FIG. 4. Table 1 gives a brief overview of the types of input expected during rule creation and how it is related and contained within the action framework. Examples are given in the context of an automated debug process for an in-circuit test system.

TABLE 1

| Name | Description |
|---|---|
| Action | An action is a step that is described in computer representation. In the illustrative embodiment, this step is undertaken to debug/optimize an in-circuit test system. An Action may or may not come with a specific instruction/algorithm. |
| One-time | A one-off test that is independent of the testing environment and is similar to a normal manual test |
| Iterative | The same action can be applied in an iterative manner. There are two categories in this class, including test result dependent and result dependent. |
| Condition | This action will be activated based on a certain criteria. The two categories in this class are test dependent and result dependent. |
| Range & Step | Action can accept the setting of hi-lo ranges and the step or increment of the search for an optimal value |
| Range & Step with execution criteria | Action can accept the setting of hi-lo ranges and the step or increment of the search for an optimal value. The application of these parameters is deemed possible if it satisfies the criteria set by the user (eg CPK). Normally, a test will be executed to measure the effectiveness of this new setting. |
| Apply offset with execution criteria | Action can accept the setting of hi-lo ranges and the step or increment of the search for an optimal value. The accepted parameters will be applied if the previous test result satisfies the execution criteria. Normally, a test will not be executed to measure the effectiveness of this new setting. |
| Choices (Checkboxes) | Action can accept the selection of options to be included for the test. |

The action framework represents the test strategy. The test strategy gives a flavor of how a test will be formulated and executed. For Condition Test Strategy, it means assessing the criteria for execution with the result of the previous test. It also determines whether if a specific set of instructions is applicable to this particular test or not. The Iterative Strategy checks for pre-test condition before formulating the test statement and gives specific instruction for some tests. The strategy also plans the combination of the test.

Figure 5:
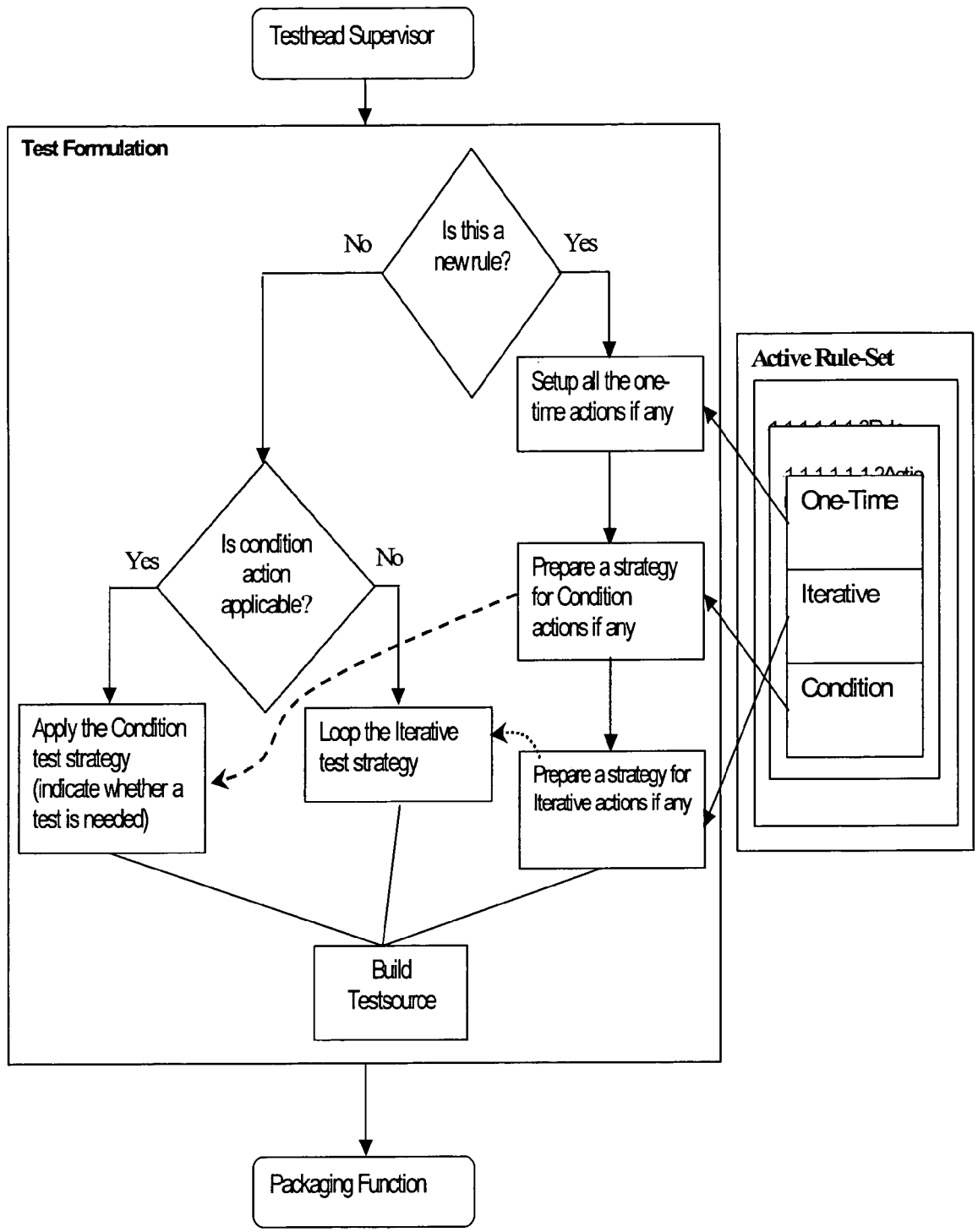
FIG. 5 is a flowchart illustrating operation of the test formulation engine of the rule-based system of FIG. 1.

FIG. 5 illustrates the example operation of the test formulation engine 3 in the rule-based system 2 of FIG. 1.

Figure 6:
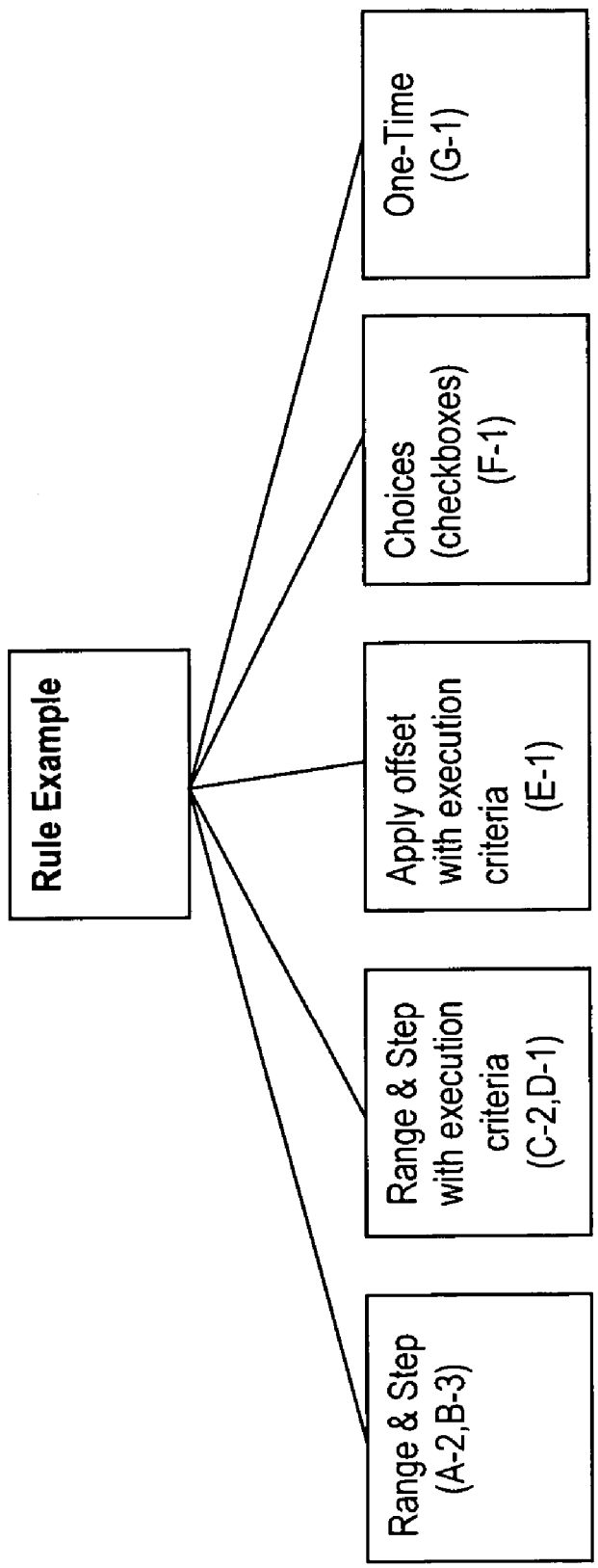
FIG. 6 is a schematic block diagram of FIG. 6 a rule with a number of associated actions.

Turning now to an example of how the test formulation engine formulates a test, FIG. 6 illustrates schematically a rule with seven actions, namely A, B, C, D, E, F and G. The actions are categorized by type, as shown. A number (indicated by "-<#>" following the name of each action indicates the number of combinations to complete the entire test for this action.

In operation, the test formulation engine performs the following sequence:

(1) One-Time—Set F1 and G1 as the fundamental of the test statement (2) Condition—Set C1, C2, D1 as result assessment and E1 as result assessment without test (3) Iterative—Set A1, A2 and B1, B2, B3 as iterative Table 2 illustrates the general execution of the test from the example of FIG. 6.

TABLE 2

| Step | One-Time | Iterative | Test Statement |
|---|---|---|---|
| 1 | F1G1 | A1B1 | F1G1A1B1 = X |
| 2 | | Condition Checking 1 | |
| Condition | If C is applicable then C1 | | X<CD> |
| A parameter enclosed by "<" and ">" means the parameter | If C is applicable & C1 then C2 If D is applicable then D1 Condition Checking 2 | | |
| may or may not be there | If C & D are not applicable & E then E1 | | X<CD>E1 (end of autodebug) |
| 3 | F1G1 | A1B2 | F1G1A1B2 = X |
| 4 | Refer to Condition with the new X statement | | |
| 5 | F1G1 | A1B3 | F1G1A1B3 = X |
| 6 | Refer to Condition with the new X statement | | |
| 7 | F1G1 | A2B1 | F1G1A2B1 = X |
| 8 | Refer to Condition with the new X statement | | |
| 9 | F1G1 | A2B2 | F1G1A2B2 = X |
| 10 | Refer to Condition with the new X statement | | |
| 11 | F1G1 | A2B3 | F1G1A2B3 = X |
| 12 | Refer to Condition with the new X statement | | |

The invention will now be discussed in the context of an automated debug and optimization system for an automated in-circuit test system. FIG. 7A is a schematic block diagram of an automated test system 2. As illustrated, the test system includes a test head 101 which supports a fixture 53 on which a printed circuit board (PCB) containing or implementing a device under test (DUT) 51 is mounted, and an automated test debug and optimization system 100. The test head 101 includes a controller 60, a test configuration circuit 50, and a measurement circuit 62. Fixture 53, for example a bed-of-nails fixture, is customized for each PCB layout and includes a plurality of probes 52 that electrically connect to nodes of the device under test 51 when the device under test 51 is properly seated on the fixture 53. Probes 52 are coupled via the fixture 53 to interface pins 54.

The test configuration circuit 50 includes a matrix 56 of relays 55 which is programmable via controller 60 over control bus 61 to open and/or close each relay 55 in the matrix 56 to achieve any desired connection between the interface pins 54 of the test head 101 and a set of measurement busses 63 internal to the test head 101. Measurement busses 63 are electrically connected to nodes of the measurement circuit 62. The particular nodes of measurement circuit 62 which are connected to the set of measurement busses 63 may be hardwired within the measurement circuit 62, or alternatively, may be configurable via another programmable matrix (not shown) of relays. Controller 60 receives test setup instructions from the automated test debug and optimization system 10 to program the matrix 56 (and other relay matrices, if they exist) to achieve a set of desired connection paths between the device under test 51 and measurement circuit 62. Automated test debug and optimization system 10, discussed in detail hereinafter, debugs and/or optimizes in-circuit tests to be performed on the device under test 51.

Figure 7B:
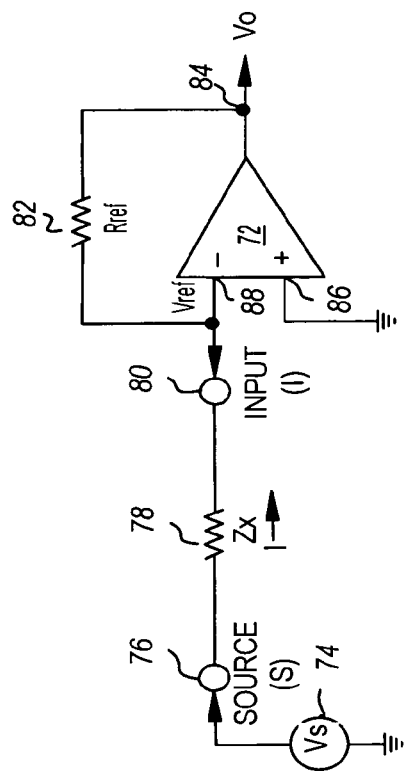
FIG. 7B is a schematic diagram of a measurement circuit.
Figure 7A:
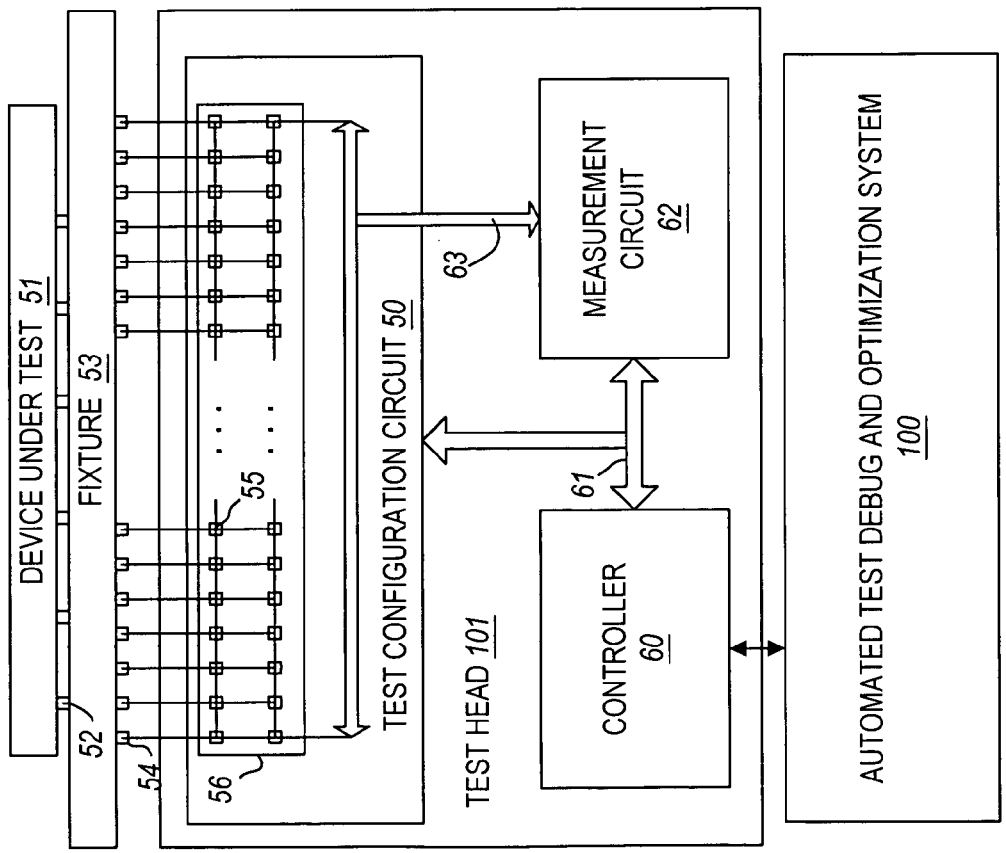
FIG. 7A is a schematic block diagram of an automated test system implemented in accordance with the invention.

FIG. 7B illustrates an example instance 70 of a measurement circuit 62. Measurement circuit 70 is known as a "two-wire" measurement circuit. Measurement circuit 70 includes operational amplifier 72 having a positive input terminal 86 coupled to ground and a negative input terminal 88 coupled to an input node I 80. A reference resistor $R_{ref}$ 82 is coupled between output node $V_O$ 84 and input node I 80 of operational amplifier 72. A component under test 78 on the DUT 51 characterized by an unknown impedance $Z_x$ is coupled between input node I 80 and a source input node S 76. The source input node S 76 is stimulated by a known reference voltage $V_S$ that is delivered by a voltage stimulus source 74. Assuming an ideal operational amplifier circuit, the current through the unknown impedance $Z_x$ of the component under test 78 should be equal to the current through reference resistor $R_{ref}$ 82 and a virtual ground should be maintained at negative input terminal 88. As is well-known in the art, in an ideal operational amplifier circuit the theoretical impedance calculation is:

$$Z_x = -R_{ref}(V_S/V_O)$$

The use of a precision DC voltage stimulus source 74 and a DC detector at output node $V_O$ 84 is employed to determine the resistive component of the output voltage when testing resistive analog components such as resistors. The use of a precision AC voltage stimulus source 74 and a phase synchronous detector at output node $V_O$ 84 is employed to determine the reactive components of the output voltage when testing reactive analog components such as capacitors and inductors.

Additional measurements, outside the scope of the present invention, are often taken to reduce guard errors and compensate for lead impedances. In order to take a set of measurements, the connection paths from the component under test 78 on the DUT 51 to the measurement circuit 62 are set up by programming the relay matrix 56 to configure the relays 55 to electrically connect the probes 52 of the bed-of-nails fixture 53 that are electrically connected to the nodes on the device under test 51 to the measurement circuit 62 via the internal measurement busses 20. In the example measurement circuit 70 of FIG. 7B, the internal measurement busses include an S bus and an I bus which are respectively electrically connected to the S node 76 and I node 80. Connections of the internal measurement busses 20 from the device under test 51 to the measurement circuit 62 are programmed at the beginning of the test for the component under test 78, during the test setup. After the connections have been made, the actual test measurements of the component under test 78 may be obtained by the measurement circuit 62 after waiting for the inherent delays of the relay connections to be completed. At the conclusion of the test, the relay connections are all initialized to a known state in preparation for the start of the next test.

The measurement circuit 70 described in FIG. 7B is for purposes of example only. FIG. 7B illustrates example hardware connections, in particular, the measurement circuit 62 of FIG. 7A, that must be provided by in-circuit ATE to perform the in-circuit test on a particular device, in this case as device characterized by an unknown impedance $Z_X$. It will be appreciated, however, that a typical in-circuit test will cover many thousands of devices, including resistors, capacitors, diodes, transistors, inductors, etc.

Figure 8:
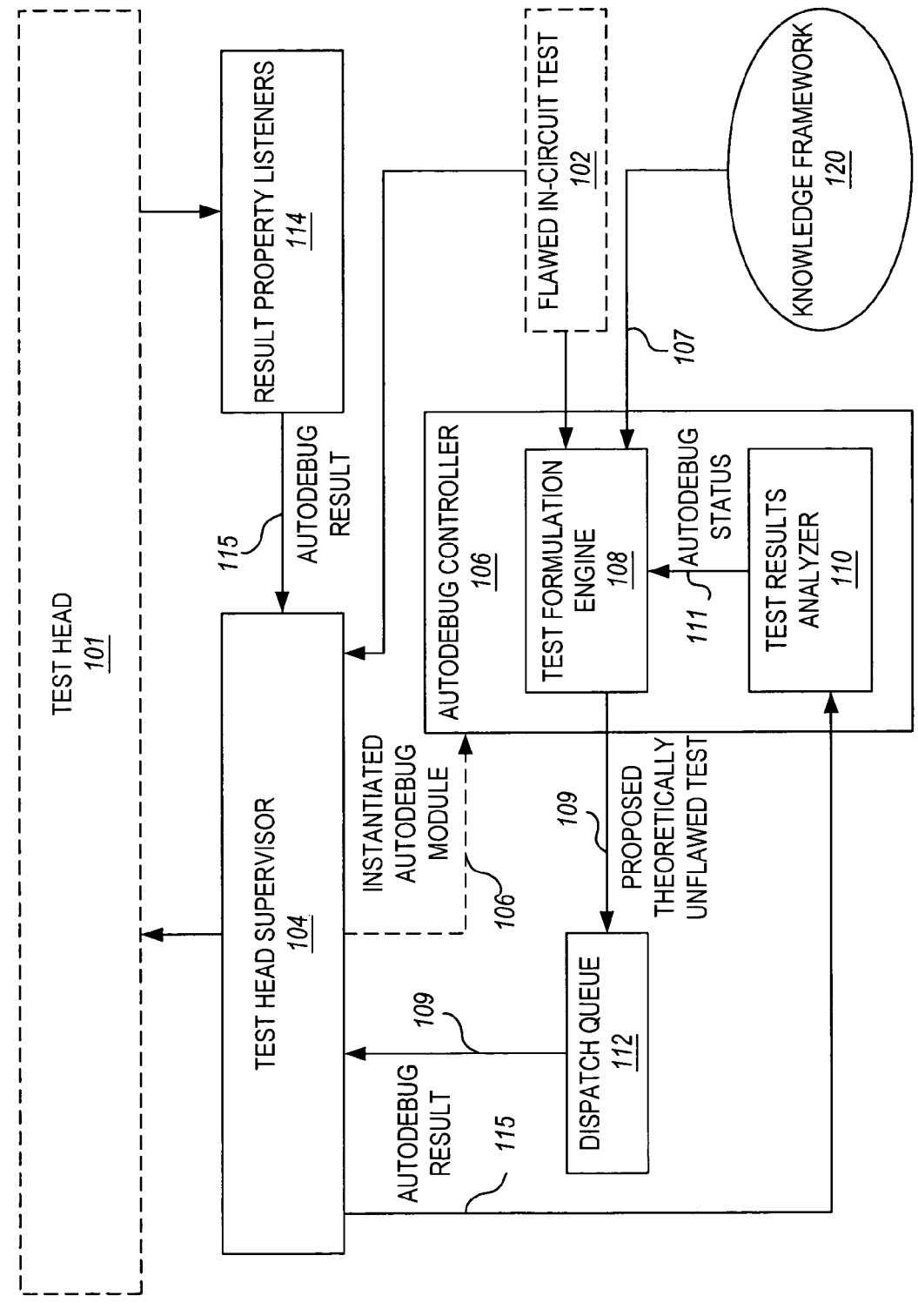
FIG. 8 is a block diagram of an automated test debug and optimization system in accordance with the invention.

An exemplary embodiment 100 of the automated test debug and optimization system 10 of FIG. 7A is shown in more detail in FIG. 8. As illustrated in FIG. 8, the automated test debug and optimization system 100 preferably includes a test head supervisor 104, an autodebug controller 106, a knowledge framework 120, a dispatch queue 112, and a result property listener 114.

The test head supervisor 104 receives a test 102 for debug/optimization. The test 102 may be received from an interactive graphical user interface test setup program or from a test file input means. Below is an example of source file R208.dat for a resistor device family.

| R208.dat |
|---|
| !!!! 2 0 1 1021582599 0000 |
| ! IPG: rev 05.00pd Thu May 16 14:56:40 2002 |
| ! Common Lead Resistance 500m, Common Lead Inductance 1.00u |
| ! Fixture: EXPRESS |
| disconnect all |
| connect s to "R208-1"; a to "R208-1" |
| connect i to "R208-2"; b to "R208-2" |
| resistor 10, 12.8, 3.75, re1, ar100m, sa, sb, en |
| ! r208" is a limited test. |
| ! DUT: nominal 10, plus tol 1.00%, minus tol 1.00% |
| ! DUT: high 10.1, low 9.9 |
| ! TEST: high limit 11.276, low limit 9.625 |
| ! Tolerance Multiplier 5.00 |
| ! Remote Sensing is Allowed |

The test 102 received by the tester will typically be packaged in a data structure that includes the information contained in the source file of the test to be debugged, and also other information such as device name, etc.

Typically the test 102 will be a flawed in-circuit test to be debugged/optimized such as a test that fails the component or is unable to determine status of one or more parameters of the test when tested on a known good board (i.e., when it is known that the component is good and the test should pass the component). Each test 102 tests a single individual component on the DUT 51 mounted on the tester, and is a representation of the test source file that has been prepared (i.e. compiled into object code and therefore no longer in the ASCII text readable format) to run/execute on a different processor on the test head 101.

The test head supervisor 104 acts as the interface between the test head 101 and automated test debug and optimization system 100 whose purpose is to protect the test head resource from overloading. In the preferred embodiment, the test head 101 itself is a single processing resource; accordingly, the test head 101 can execute only a single job in any given time slot. The test head supervisor 104 operates to protect the test head by monitoring the allocation of the test head 101 resource. In the preferred embodiment, the test head supervisor 104 is implemented as a Java thread, which processes various jobs that are to be sent to the test head 101. When the test head supervisor 104 receives a test 102 to be debugged/optimized, it activates an autodebug controller 106. The method of activation depends on the particular implementation of the automated test debug and optimization system 100. For example, the autodebug controller 106 may be implemented as a static procedural function that receives the test 102 (or a pointer to the test 102) as a parameter. In yet another embodiment the autodebug controller 106 is implemented as hardware with a separate processor and memory for storing program instructions for implementing the functionality of the autodebug controller 106. In the preferred embodiment, the test head supervisor 104 instantiates an autodebug controller 106 object, passing it the received test 102, whose lifetime begins when instantiated by the test head supervisor 104 for debug/optimization and ends upon completion of the debug/optimization process for the received test 102.

The autodebug controller 106 includes a test formulation engine 108 which generates one or more proposed theoretically unflawed tests 109 that are ready for execution by the test head 101 during the lifetime of the autodebug controller 106. In generating the proposed theoretically unflawed test 109, the test formulation engine 108 accesses the knowledge framework 120 to determine the appropriate actions to take, the validation criteria, and stability criteria.

Figure 9:
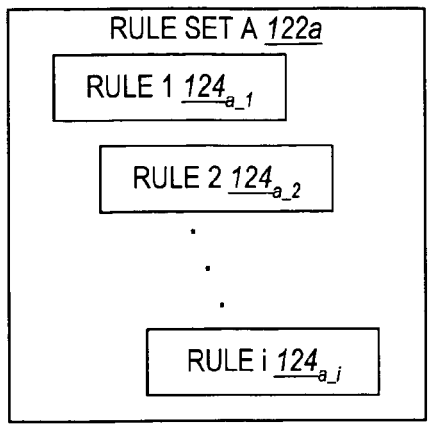
FIG. 9 is a block diagram of a knowledge framework in accordance with the invention.
Figure 9:
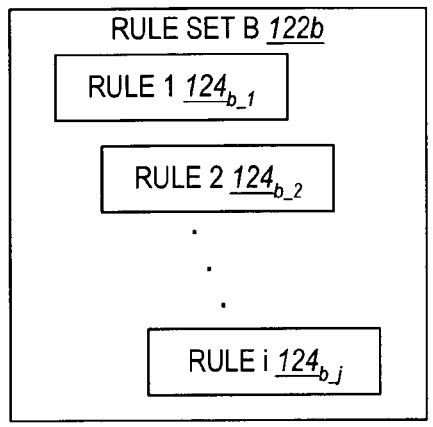
Figure 9:
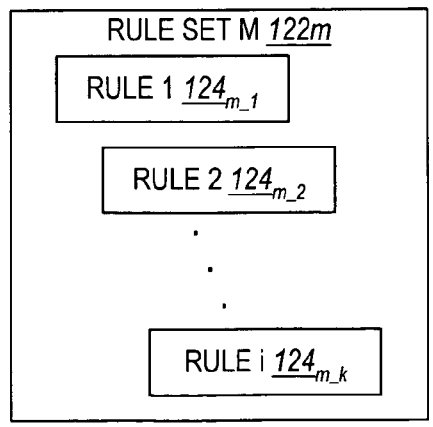
Figure 10:
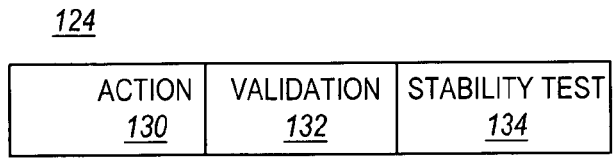
FIG. 10 is a structural diagram of a rule.

The knowledge framework 120 contains the test knowledge about the various components to be tested on the DUT 51, which allows the autodebug controller 106 to determine how to formulate and package a given test. A more detailed diagram of a preferred embodiment of the knowledge framework 120 is illustrated in FIG. 9. As shown therein, the knowledge framework 120 includes one or more rule sets $122_a, 122_b, \ldots, 122_m$. Each rule set $122_a, 122_b, \ldots, 122_m$, has associated with it one or more rules $124_{a\_1}, 124_{a\_2}, \ldots, 124_{a\_i}, 124_{b\_1}, 124_{b\_2}, \ldots, 124_{b\_j}, 124_{m\_1}, 124_{m\_2}, \ldots, 124_{m\_k}$. FIG. 10 illustrates the structure 124 of each rule $124_{a\_1}, 124_{a2}, \ldots, 124_{a\_i}, 124_{b\_1}, 124_{b\_2}, \ldots, 124_{b\_j}, 124_{m\_1}, 124_{m\_2}, \ldots, 124_{m\_k}$. As shown in FIG. 10, each rule preferably includes three components, including an action component 130, a validation test component 132, and a stability test component 134 (e.g., a process capability index (CPK)).

The action component 130 represents the debugging/optimization strategy. The action component 130 can implement or point to code such as library functions that are to be executed.

The validation test component 132 comprises or points to a test or algorithm that compares an expected result against the actual results measured by the tester. Typically the validation test component 132 will include many expected parameter values to be verified against the received parameter values in order to verify that the proposed theoretically unflawed test 109 passed.

The stability test component 134 is conducted to verify the robustness of a test. During operation, the stability test component 134 is only performed if the validation test passes. Stability test is conducted by applying the validity test a number of times to gather its statistical value (e.g., the process capability index CPK). The CPK is a measurement that indicates the level of stability of the formulated test derived from the knowledge framework 120.

The knowledge framework 120 includes a rule set for every possible component (e.g., resistor, car, diode, FET, inductor, etc.) to be tested on the DUT 51. The autodebug controller 106 operates at an active rule-set level. Each device/component family can have many rule sets, but at any given time, only one rule set in the knowledge framework 120 can be active. The test formulation engine 108 in the autodebug controller 106 executes only the rules in the active rule set for each device/component family.

The set of rules 124 in each rule set 122 are ordered according to a predetermined priority order. The test formulation engine 108 executes the rules within the rule set according to the predetermined priority order. In particular, the test formulation engine 108 generates a list of parameters/measurements that the test head should obtain based on the action component 130 and validation component 132 of the currently selected rule 124 of the active rule set 122. This list of parameters/measurements represents the merits of the test from which the component being tested can be classified as "good" or "bad". Other classifications are possible.

Once the test formulation engine 108 generates a proposed theoretically unflawed test 109, the proposed theoretically unflawed tests 109 is sent to a dispatch queue 112. The dispatch queue 112 stores testhead-ready tests in priority order (e.g., first-in first-out) in a queue. As the test head resource comes available, the test head supervisor 104 removes a test from the queue, and dispatches it to the test head 101 for execution.

The result property listeners 114 monitor status and data coming back from the test head 101 and packages the status and data into autodebug results 115. The autodebug results 115 comprise the test parameters that are actually measured by the test head during execution of the test. The autodebug results 115 are passed back to the test head supervisor 104, indicating that test execution on the test head 101 is complete and that the test head 101 resource is freed up for a new job. The test head supervisor 104 forwards the autodebug results 115 on to the autodebug controller 106, and if there are additional jobs waiting for dispatch to the test head 101 present in the dispatch queue 112, removes the next job from the queue 112 and allocates the test head 101 resource to execution of the next job.

The autodebug controller 106 includes a test results analyzer 110. The test results analyzer 110 processes the autodebug results 115 from the tester, comparing the actual parameters/measurements to those expected as indicated in the test validation component 132 of the rule 124 from which the proposed theoretically unflawed test 109 was generated.

If one or more of the actual test parameters does not meet the expected parameters/measurements set forth by the test validation component 132 of the rule 124 from which the proposed theoretically unflawed test 109 was generated, the test is considered bad and is discarded. If additional unprocessed rules 124 in the active rule set 122 remain to be processed, the test formulation engine 108 then selects the next highest priority rule 124 from the set 122, and generates a new proposed theoretically unflawed test 109 based on the selected new rule.

The process is repeated until a valid proposed theoretically unflawed test 109 is found. Once a valid proposed theoretically unflawed test 109 is found, then the test is re-executed one or more iterations to generate actual stability levels (e.g., CPK) and compared to the required stability criteria as set forth in the stability component 132 of the rule 124 from which the current proposed theoretically unflawed test 109 was generated. If the current proposed theoretically unflawed test 109 passes the stability test, it is considered a valid test.

The following sequence details how the test results analyzer 110 proceeds based on received test results 115.

1. Valid Test
   a. If Pass then check Stability Test
      i. If On then Proceed to run this test N times for stability testing (put this entry into queue as multiple test ID)
      ii. If Off then Inform Testhead Supervisor of the status
   b. If Fail then Continue to search for valid test
2. Stability Test
   a. If Pass then Inform Testhead Supervisor of the status
   b. If Fail then Continue to search for valid test If the automated test debug and optimization system 100 is configured to perform debug only, once a valid proposed theoretically unflawed test 109 is found, the valid proposed theoretically unflawed test 109 is preferably used in place of the test 102 presented for debug, and processing of the test 102 is complete.

If the automated test debug and optimization system 100 is configured to perform optimization also, the test formulation engine 108 will formulate all possible valid proposed theoretically unflawed tests 109 (that meet validity and stability tests) and will then select the particular valid proposed theoretically unflawed test 109 that best meets the validity and stability criteria. This selected "best" test is then used in place of the test 102 presented for debug, and processing of the test 102 is complete.

Figure 11A:
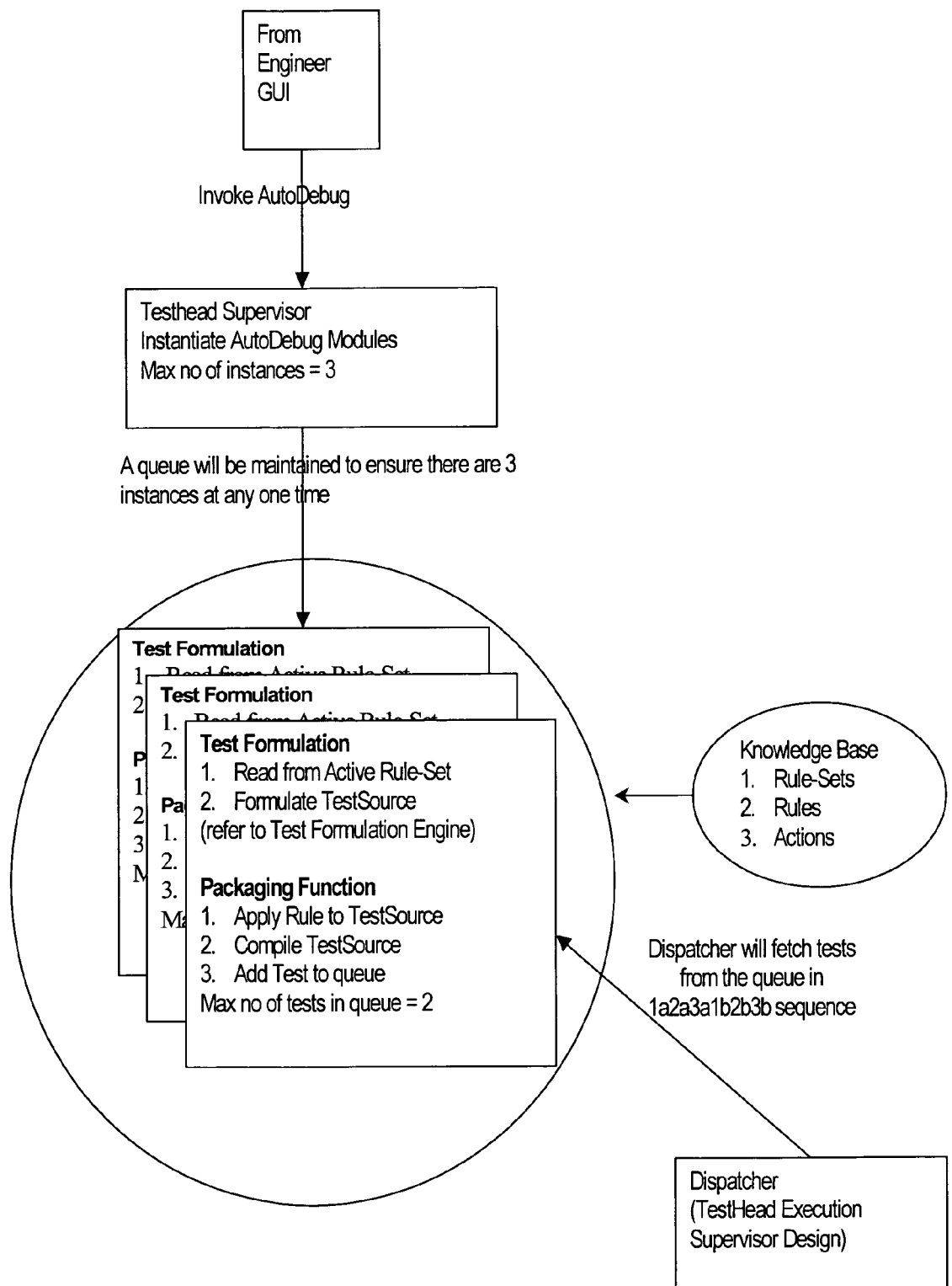
FIG. 11A is a block diagram of a preferred embodiment of a test formulation engine.
Figure 11B:
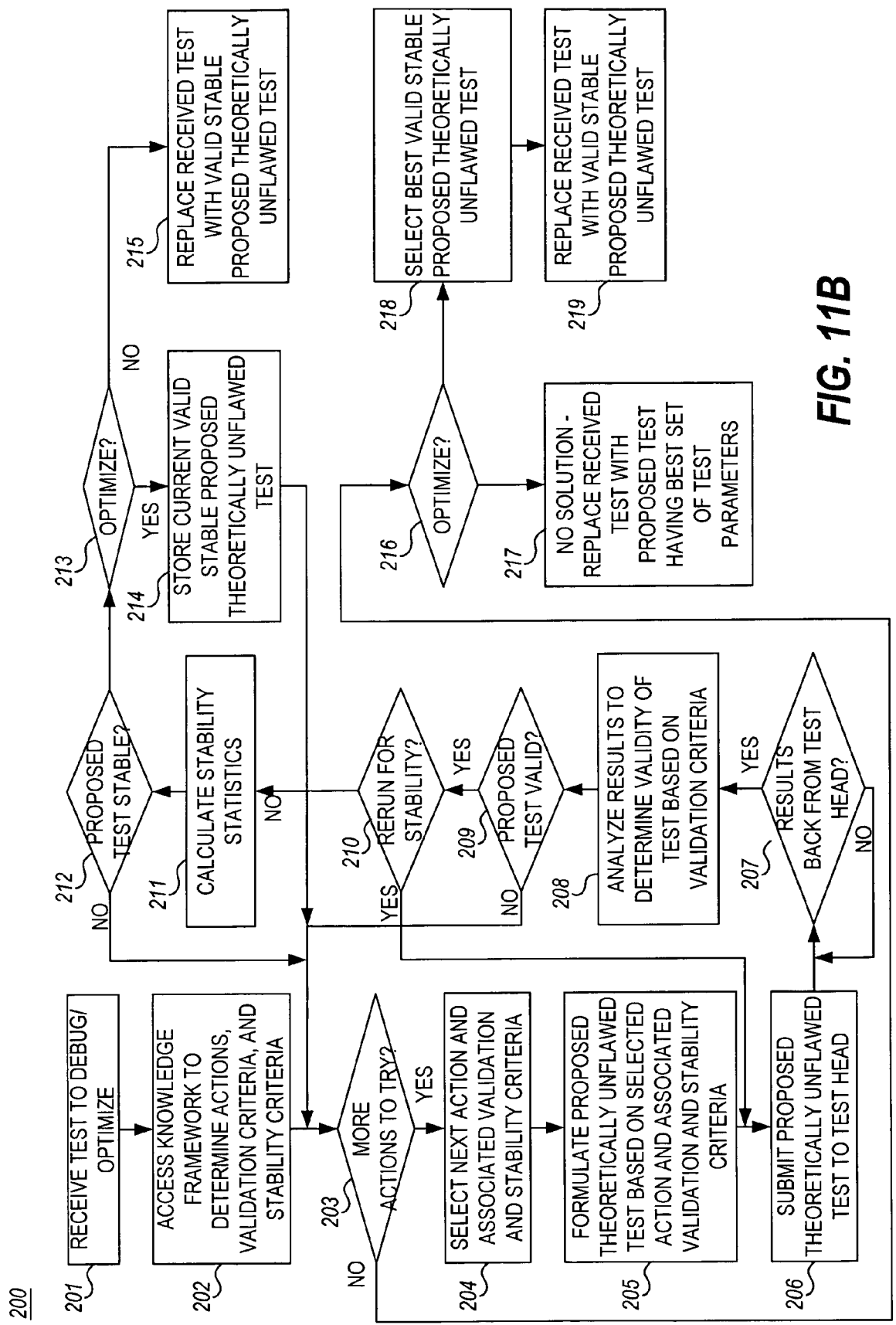
FIG. 11B is a flowchart of a preferred method performed by the test formulation engine of FIG. 11A.

FIG. 11A is a block diagram of, and FIG. 11B is a flowchart illustrating the general operation of, the autodebug controller 106 of FIG. 11A. As illustrated in FIGS. 6A and 6B, the autodebug controller 106 receives a test 102 to be debugged and/or optimized (step 201). The test formulation engine 108 accesses the knowledge framework 120 to determine the actions, validation criteria, and stability criteria appropriate to the component being tested by the test 102 (step 202). As discussed previously, in the preferred embodiment, the knowledge framework 120 includes one or more rule sets, each with one or more rules having associated actions, validation criteria, and stability criteria. In this preferred embodiment, the autodebug controller 106 activates the rule set corresponding to the component being tested by the test 102. The autodebug controller 106 then determines whether there are more possible actions to try in formulating a valid test, as determined from the knowledge framework 120 (step 203). If more actions exist to try in formulating a valid test, the autodebug controller 106 selects the next action and its associated validation and stability criteria (step 204). The autodebug controller 106 then formulates a proposed theoretically unflawed test 109 based on the selected action and its associated validation and stability criteria (step 205). The proposed theoretically unflawed test 109 is then submitted to the test head 101 for execution (step 206).

The autodebug controller 106 awaits results of the proposed theoretically unflawed test 109 from the test head 101 (step 207). When the results are returned from the test head 101, the autodebug controller 106 then analyzes the returned test results to determine whether the proposed theoretically unflawed test 109 is valid based on the validation criteria. As also discussed previously, generally the validation criteria consists of a series of expected parameter measurements. Accordingly, in this embodiment, the autodebug controller 106 compares the actual parameter measurements as received in the test results to the expected parameter measurements. If the actual parameter measurements meet the validation criteria (i.e., match the expected parameter measurements), the proposed theoretically unflawed test 109 is considered valid; otherwise invalid. If the proposed theoretically unflawed test 109 is not valid (determined in step 209), the autodebug controller 106 returns to step 203 to determine whether more actions are available to try.

If the proposed theoretically unflawed test 109 is valid (determined in step 209), the autodebug controller 106 determines whether or not the proposed theoretically unflawed test 109 should be rerun to collect stability measurements for the stability test (step 210). If so, the autodebug controller 106 returns to step 206 to resubmit the proposed theoretically unflawed test 109 to the test head for execution.

When running the stability test, steps 206 through 210 are repeated until a specified number of runs and/or sufficient statistical data is collected. Once the statistics are collected, the autodebug controller 106 calculates the stability statistics (step 211) and determines whether the proposed theoretically unflawed test 109 is stable based on the calculated statistics and the stability criteria specified in the knowledge framework 120 (step 212). If the proposed theoretically unflawed test 109 is not stable, the autodebug controller 106 returns to step 203 to determine whether more actions are available to try.

If the proposed theoretically unflawed test 109 is not stable, the autodebug controller 106 determines whether the test should be optimized (step 213). If not, the current valid stable proposed theoretically unflawed test 109 preferably is used in place of the received test 102 when testing the DUT 51 (step 215).

If optimization is required, the autodebug controller 106 stores the current valid stable proposed theoretically unflawed test 109 (step 214) and returns to step 203 to determine whether more actions are available to try. Steps 204 through 214 are repeated until all actions have been formulated into proposed theoretically unflawed tests and validated/invalidated and stability checks have been performed on the validated proposed theoretically unflawed tests.

When the autodebug controller 106 determines that no more actions are available to try (step 203), the autodebug controller 106 determines whether this point in the process was reached due to optimization or whether it was reached because no valid test could be found (step 216). If no valid test could be found, the autodebug controller 106 generates a status indicating that no solution to the received test 102 was found and preferably presents the "best" test in terms of parameters to be used in place of the test 102 presented for debug (step 217). If, on the other hand, the autodebug controller 106 tested all possible actions due to optimization, it selects the best valid stable proposed theoretically unflawed test based on validation criteria and how well each of the possible valid stable proposed theoretically unflawed tests meet the validation/stability criteria (step 218). The autodebug controller 106 then preferably uses the selected best valid stable proposed theoretically unflawed test in place of the received test 102 when testing the DUT 51 (step 219).

Figure 12:
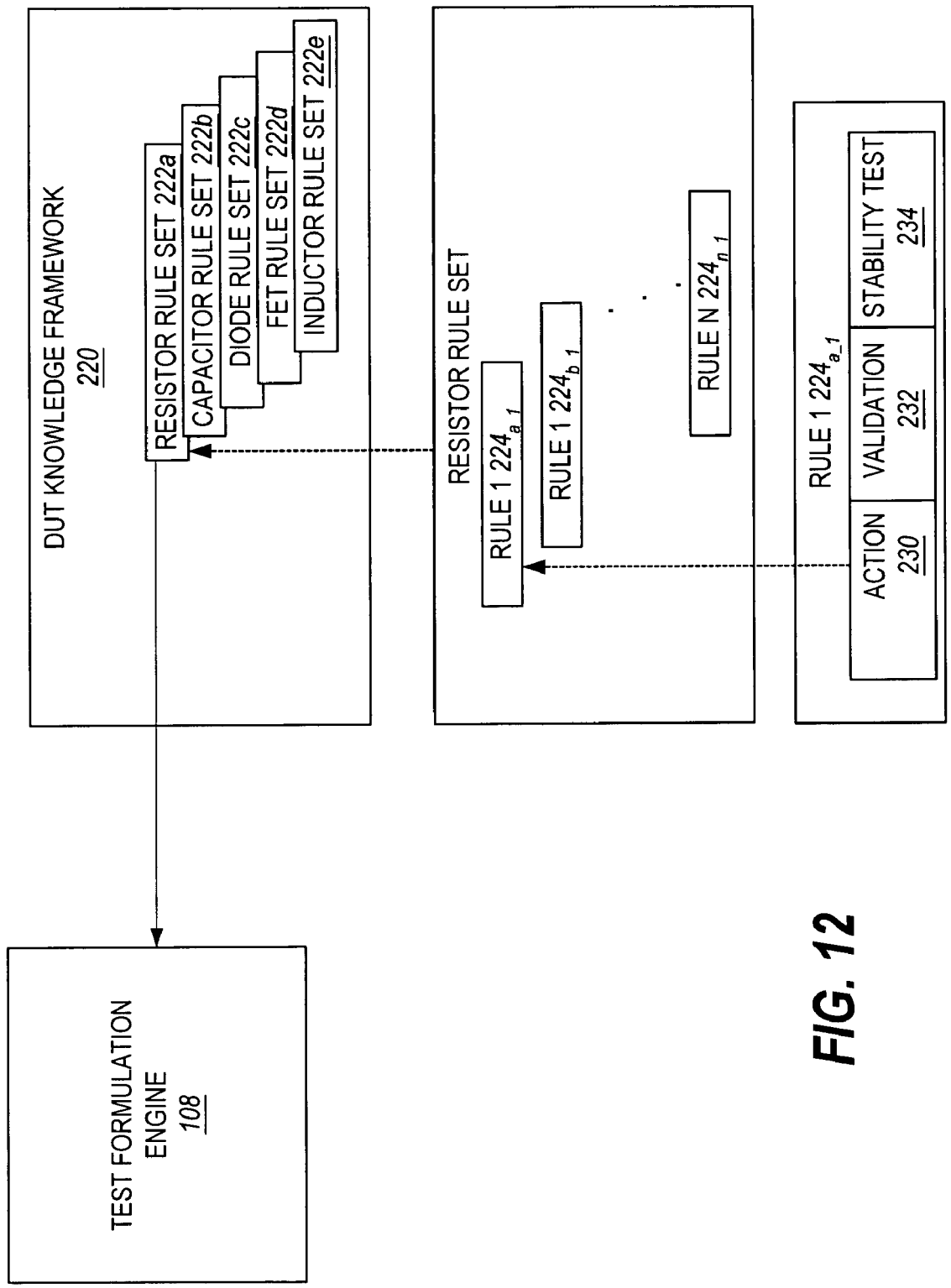
FIG. 12 is a block diagram of an example knowledge framework in accordance with the invention.

FIG. 12 illustrates an example knowledge framework 220 for a DUT 51 comprising a plurality of components/devices to be tested. As shown in this example, the active rule set is a resistor rule set 222a. The resistor rule set 222a includes a plurality of rules $224_{a\_1}, 224_{a\_2}, \ldots, 224_{a\_n}$. The test formulation engine 108 processes, in priority order, each $224_{a\_1}, 224_{a\_2}, \ldots, 224_{a\_n}$ in the active rule set, in the illustrative case, resistor rule set 222a.

Below is an example ruleset.xml file illustrating an example rule set definition file. The ruelset.xml file is an XML file that describes the relationship between the device to be tested, the rule set and the rule.

Ruleset.xml

```
<?xml version="1.0" encoding="UTF-8" ?>
- <Ruleset>
  + <Device ID="Jumper">
  + <Device ID="Resistor">
  + <Device ID="Fuse">
  - <Device ID="Capacitor">
      - <Ruleset ID="Joseph">
          <Rule ID="AutoDebug Guards" />
          <Rule ID="Set Amplitude with AutoDebug Guards" />
          <Rule ID="Set Amplitude" />
        </Ruleset>
    </Device>
    <Device ID="Diode/Zener">
    <Device ID="Transistor">
    <Device ID="Inductor">
    <Device ID="FET">
    <Device ID="Switch">
    <Device ID="Potentiometer">
  </Ruleset>
```

A key to the ruleset.xml file describing the contents is shown in TABLE 3.

TABLE 3

| Element | Attribute | Description |
| --- | --- | --- |
| Device | ID | Name of device family. |
| Rule set | ID | Name of rule set in a device family. Rule set name is unique in a device family |
| Rule | ID | Unique identifier of a rule. |

A rule set consists of rules in terms of running sequence priority. In any given ruleset.xml, there may be multiple rule sets defined, which means that as many rule sets may be defined as needed. Each rule set is tagged to a specific device family. Every rule set will contain rule(s). The ruleID is used to identify the action of the rule as found in rule.xml.

The rule.xml contains the rule database. Every rule can have its combination of actions and their associated inputs. The inputs represent localized information pertaining to this single action.

One single action can be applied to different rule with different localized content. The input is a set of criteria that control the behavior of the action algorithm. An action represents a specific set of code that is run in the test formulation engine.

Below is an example ruleset.xml file illustrating an example rule set definition file. The ruelset.xml file is an XML file that describes the relationship between the device to be tested, the rule set and the rule.

Rule.xml

```
<?xml version="1.0" encoding="UTF-8" ?>
- <RuleDB>
  + <Rule ID="Set Amplitude">
  - <Rule ID="Set Amplitude with AutoDebug Guards">
      <Description value="Setting amplitude" />
      <Device ID="Capacitor" />
      <Validation-Gain maximum="10" minimum="0.0"
        name="Gain" status="True" />
      <Validation-Phase maximum="20" minimum="0.0"
        name="Phase" status="True" />
```

-continued

Rule.xml

```
      - <Stability>
          <Status value="True" />
          <CPK value="1.0" />
          <Run value="5" />
        </Stability>
        <Merge value="False" />
        <Auto-Adjust maximum="" minimum=""
          offset-type="Percentage" type="0" />
        <Action ID="1" />
      - <Action ID="2">
          <Input ID="1" value="1" />
          <Input ID="2" value="10" />
          <Input ID="3" value="1" />
          <Input ID="4" value="1" />
          <Input ID="5" value="10" />
          <Input ID="6" value="1" />
        </Action>
    </Rule>
  + <Rule ID="AutoDebug Guards">
  + <Rule ID="Enhancement">
  + <Rule ID="Swap S and I">
  + <Rule ID="Swap S and I with AutoDebug Guard">
</RuleDB>
```

A key to the Rule.xml file describing the contents is shown in TABLE 4.

TABLE 4

| Element | Attribute | Description |
| --- | --- | --- |
| Rule | ID | Unique identifier of a rule. |
| Description | Value | Rule description |
| Device | ID | Device that is applicable |
| Validation-Gain | Maximum | Maximum gain value for validation purposes. |
| | Minimum | Minimum gain value for validation purposes. |
| | Name | Name |
| | Status | Status of the validation item. True False |
| Validation-Phase | Maximum | Maximum phase value for validation purposes. |
| | Minimum | Minimum phase value for validation purposes. |
| | Name | Name |
| | Status | Status of the validation item. True False |
| Stability | Status | Status of the validation item. True False |
| | CPK | CPK value |
| | Run | Number of run |
| Merge | Value | Indicator to merge with existing test source True False |
| Auto Adjust | Maximum | Maximum value for auto adjust |
| | Minimum | Minimum value for auto adjust |
| | Offset-Type | Offset value type Percentage Absolute |
| | Type | Auto adjust type None Test Value Test Limit |
| Action | ID | Unique identifier for system defined action. Refer to Action Listing for the list of action |

TABLE 4-continued

| Element | Attribute | Description |
|---------|-----------|-------------|
| Input | ID | Identifier for the input type: e.g.: Lower Range Upper Range Step Resolution |
|  | Value | Value for the input type |

Figure 13:
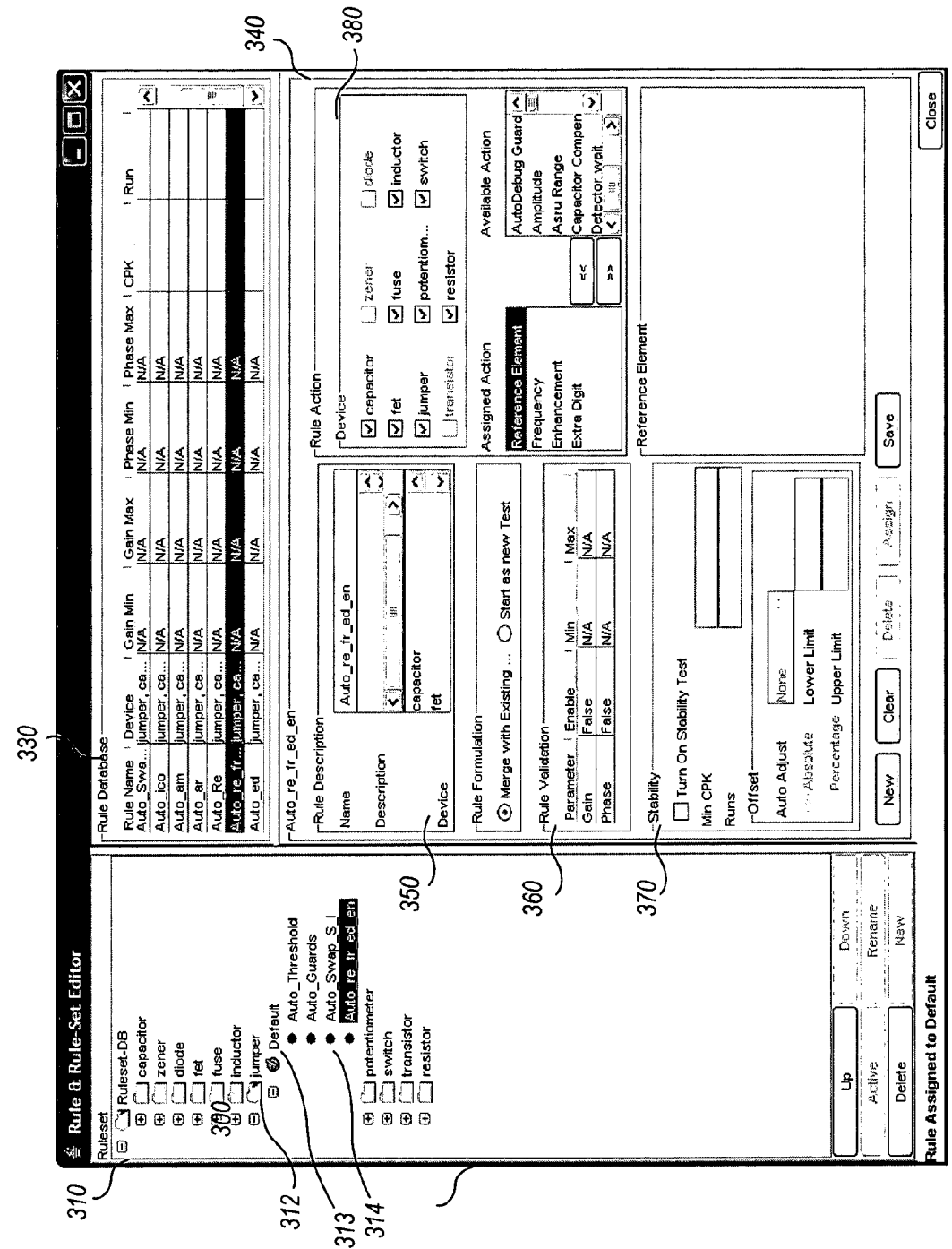
FIG. 13 is an example graphical user interface screen of a preferred embodiment user input GUI of FIG. 8.

FIG. 13 illustrates an example graphical user interface screen 300 of a preferred embodiment user input GUI for the system of FIG. 8. As illustrated, the screen 300 includes a rule set panel 310, a rule database panel 330, and a rule panel 340. The rule panel 340 includes a description panel 350, a validation criteria panel 360, a stability test panel 370, and an action panel 380.

The rule set panel 310 contains the name of all available rule sets. In the preferred embodiment, the rule set panel 310 lists all devices that may be tested. The list is in the form of a device family tree 312, which includes three levels of display. At the first, or top, level 312 of the device family tree, the name of the device is listed. At the next level 313 of the device family tree, the name(s) of the each rule set associated with the named device is listed, and at the next, or bottom, level 314 of the tree, name(s) of each rule that is associated with the named rule set is listed.

Table 5 provides a description of each field on the rule set panel 310.

TABLE 5

| Field Name | Description |
|------------|-------------|
| Rule Set | List of rule set for each device family. Active Rule set is highlighted with shaded node. Upon clicking on the rule set, the node is expanded to display all rules in assigned priority sequence. |
| Rule | List of all rules assigned to the device family. Upon clicking on the rule, the selected rule will be highlighted in the rule database panel. Details of the rule are displayed on the screen. |

| Buttons | |
|---------|---|
| Button | Action |
| Up Arrow | Upon clicking on this button, system swaps the selected item with the item above it. This button is disabled if the node is the first node in the level. |
| Down Arrow | Upon clicking on this button, system swaps the selected item with the item below it. This button is disabled if the node is the first node in the level. |
| Set Active | Upon clicking on this button, if the selected rule set is an active rule set, the rule set is change to in-active rule set. Otherwise, the rule set is set as active rule set This button is enabled if the selected item is a rule set |
| Delete | Upon clicking this button, dialog box is display for the user to confirm if he wants to delete the selected item. If Yes, the selected item is deleted from the tree. Otherwise, system does nothing. This button is enabled if the selected item is a rule set or rule. |
| Rename | Upon clicking this button, Rename Rule set screen is displayed. This button is enabled if the selected item is a rule set |
| New | Upon clicking this button, New Rule set screen is displayed. This button is enabled if the selected item is a device |

The rule database panel 330 lists all rules 331 available for the selected device family 312. Table 6 provides a description of each field on the rule set panel 330.

TABLE 6

| Field Name | Description |
|------------|-------------|
| Device Name | Device Family Name |
| Name | Name of the rule |
| Meas Min | Lower Limit for Meas |
| Gain Max | Upper Limit for Gain |
| Phase Min | Lower Limit for Phase |
| Phase Max | Upper Limit for Phase |
| Runs | Number of runs if the stability is applicable |
| CPK | Process Capability if the stability is applicable |

Upon selecting a row in the rule database panel 330, the details of the rule are displayed in the rule panel 340.

Rules are executed according to the sequence shown in the device family tree of the rule set panel 310.

The rule panel lists the details of the selected rule. Table 7 provides a description of each field on the rule panel.

TABLE 7

| Field Name | Description | Type | Mandatory |
|------------|-------------|------|-----------|
| Device | Device Family | Dropdown list | ✓ |
| Name | Name of the rule | Varchar | ✓ |
| Description |  | Varchar |  |
| Enable | Enable the parameter. | Boolean |  |
| Max | Upper Limit | Numeric |  |
| Min | Lower Limit | Numeric |  |
| Turn On stability Test | If the checkbox is ✓, the Min CPK and Runs textboxes are enabled. Otherwise the textboxes are disabled. | Checkbox |  |
| Min CPK | Minimum CPK | Numeric | ✓ if Turn On stability Test is True |
| Runs | Number of runs | Numeric | ✓ if Turn On stability Test is True |
| Merge With Existing Test | Indicator to merge with the existing test. The existing test will be treated as an one time action. | Checkbox |  |
| Assigned Actions | List of actions assigned to the selected rule. Action is unique in the list. | List box |  |
| Action Database | List of all actions in the system, filter by the selected device family. | List box |  |
| Name | Action Name | Textbox (Read Only) | ✓ |
| Description | Action description | Textbox Read Only) |  |
| Type | 3 Types of action: Iterative One-time Conditions | Textbox Read Only) Dropdown list. >> if user is allow to change the type of action then dropdown list is to be used. | ✓ |

TABLE 7-continued

| | | |
|---|---|---|
| >>Input required field | Different Required Input fields are to be displayed according to the action specification. | ✓ |

Buttons

| Button | Action |
|---|---|
| New | Upon clicking on this button, all rule fields are open for editing.<br>System is ready to accept new rule. |
| Clear | Upon clicking on this button, all rule fields are cleared. |
| Delete | Upon clicking on this button, system verifies if the rule is being assigned to any rule set. If yes, prompt user to delete the rule in each rule set. Otherwise, prompt user to confirm the deletion of the rule. If user confirms to delete the rule, the rule is deleted. Otherwise, system does nothing. |
| Assign | Upon clicking this button, if rule set is selected on the tree, the rule is added as the last rule of the selected rule set. This button is disabled if it meets any one of the following criteria exists:<br>    No rule set or rule selected on the tree<br>    The current display rule is assigned to the rule set<br>    The rule is not valid rule for the device. |
| Save | Upon clicking on this button, the rule informations will be saved.<br>System should check for mandatory information.<br>If the rule is assigned to other rule set, prompt user if he wants to continue as the changes will affect the rule1 in other rule set. If Yes, the system saves the information. Otherwise, system does nothing. |
| >> | Remove Action from the rule.<br>Upon clicking on this button, the selected Action is removed from the list and added in the Action Database.<br>System search refresh the following:<br>Device family: list of device that is valid for the remaining Actions<br>Action Database: list of device that is valid for the remaining Actions |
| << | Assign Action to the rule.<br>Upon clicking on this button, the selected Action is removed from the list and added in the Action Database.<br>System search for the list of device that is valid for the remaining Actions |

In the graphical user interface screen 300 of the user input GUI 7, actions are predefined, and the user is not allowed to add or change the definition of an action.

The user input GUI 7 and knowledge framework interface 6 together are used to map knowledge into actions. The user input GUI 7 captures the user input and the knowledge framework interface 6 stores the captured information in the knowledge framework 5 in the format described previously. As described previously, the action framework includes three categories of actions, including one-time, iterative, and conditional. Table 8 lists several types of actions and how they map to the action categories. Other action types may exist.

TABLE 8

| Type | AutoDebug Categorization |
|---|---|
| 1. Specific Instruction<br>  a. An algorithm<br>  b. A known decision making flow<br>  c. Fixed stepping of range in a known sequence | For all actions |
| 2. Range & Step | Iterative |
| 3. Range & Step with execution criteria (based on result) | Condition (Iterative) |
| 4. Apply offset(+/−) with execution criteria<br>e.g. change threshold - if measured value falls within an acceptance range, modify the threshold (+/−offset) | Condition (One-Time) |
| 5. Choices - (A or B or C) OR all | One-Time/ Iterative |
| 6. Set Action (turn this action ON) - no GUI | One-time |

It will be appreciated that the above examples, file formats, and layouts are presented for purposes of example only and not limitation. The knowledge framework 120 may be implemented according to any number of different formats and structures and need only include the knowledge for actions and associated validation and optionally stability criteria that may be accessed by the autodebug controller in formulating proposed theoretically unflawed tests for a given component. It will also be appreciated that all of the above methods of operation are typically embodied in one or more computer readable storage mediums that tangibly embody program instructions implementing the described methods shown in the figures. Each of the controllers shown in the figures may be implemented in hardware, software, or a combination of the two.

It will be appreciated from the above detailed description that the invention provides a technique and knowledge framework that represents the binding of knowledge and experience into a reusable rule format and storage that can be used by a test formulating engine in creating viable tests. The GUI provides a method for binding complex actions into rules and rule sets for tester consumption. In the illustrative embodiment, the technique is applied to allow an automated in-circuit test debugging process to automatically validate and debug automatically generated automated in-circuit tests.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A method for configuring an automated test associated with a component to be tested on a tester, the method comprising the steps of:
    associating one or more validation criteria with one or more actions to be performed to generate first associations;
    associating the one or more actions with one or more rules to generate second associations;
    associating one or more of the one or more rules with the component to be tested on the tester to generate third associations;
    maintaining a knowledge framework comprising the first associations, the second associations, and the third associations.

2. The method of claim 1, further comprising the steps of:
    obtaining the one or more validation criteria;
    obtaining the one or more actions; and
    obtaining the one or more rules.

3. The method of claim 1, further comprising:
- associating the one or more of the one or more rules with a rule set; and
- associating the rule set with the component to be tested.

4. The method of claim 3, further comprising:
- maintaining the rule set in the knowledge framework.

5. The method of claim 3, wherein:
- the one or more rules associated with the rule set each have an associated priority level indicating an order that the respective rule should be processed with respect to others of the one or more rules associated with the rule set.

6. A computer readable storage medium tangibly embodying program instructions implementing a method for configuring an automated test associated with a component to be tested on a tester, the method comprising the steps of:
- associating one or more validation criteria with one or more actions to be performed to generate first associations;
- associating the one or more actions with one or more rules to generate second associations;
- associating one or more of the one or more rules with the component to be tested on the tester to generate third associations;
- maintaining a knowledge framework comprising the first associations, the second associations, and the third associations.

7. The computer readable storage medium of claim 6, further comprising the steps of:
- obtaining the one or more validation criteria;
- obtaining the one or more actions; and
- obtaining the one or more rules.

8. The computer readable storage medium of claim 6, further comprising:
- associating the one or more of the one or more rules with a rule set; and
- associating the rule set with the component to be tested.

9. The computer readable storage medium of claim 8, further comprising:
- maintaining the rule set in the knowledge framework.

10. The computer readable storage medium of claim 8, wherein:
- the one or more rules associated with the rule set each have an associated priority level indicating an order that the respective rule should be processed with respect to others of the one or more rules associated with the rule set.

11. A computerized system, the system comprising:
- a knowledge framework interface which associates one or more validation criteria with one or more actions to be performed to generate first associations, associates the one or more actions with one or more rules to generate second associations, associates one or more of the one or more rules with a component to generate third associations; and
- a knowledge framework which stores the first associations, the second associations, and the third associations.

12. The system of claim 11, further comprising:
- a user input interface which obtains the one or more validation criteria, the one or more actions, and the one or more rules.

13. A knowledge framework for storing configuration of an automated test, comprising:
- one or more rule sets, each comprising one or more rules having associated actions and validation criteria.

14. The knowledge framework of claim 13, wherein:
- the one or more rules associated with at least one of the one or more rule sets each have an associated priority level to indicate order of priority.

15. A computer readable storage medium, comprising:
- a knowledge framework, the knowledge framework comprising one or more rule sets, each the one or more rule sets comprising one or more rules, the one or more rules each having associated actions and associated validation criteria.

16. The computer readable storage medium of claim 15, wherein:
- the one or more rules associated with at least one of the one or more rule sets each have an associated priority level to indicate order of priority.

17. A user interface, comprising:
- a validation criteria input which obtains one or more validation criteria;
- an action input which obtains one or more actions; and
- a rule input which obtains one or more rules;
- a knowledge framework interface which associates the one or more validation criteria with one or more of the one or more actions to generate first associations, associates one or more of the one or more actions with one or more of the one or more rules to generate second associations, and which associates one or more of the one or more rules with a component to be tested on a tester to generate third associations.

18. The user interface of claim 17, wherein:
- the knowledge framework interface stores the first associations, the second associations, and the third associations in a knowledge framework.

* * * * *